US006329088B1

(12) United States Patent
Landini et al.

(10) Patent No.: US 6,329,088 B1
(45) Date of Patent: Dec. 11, 2001

(54) SILICON CARBIDE EPITAXIAL LAYERS GROWN ON SUBSTRATES OFFCUT TOWARDS <1$\bar{1}$00>

(75) Inventors: Barbara E. Landini, New Milford; George R. Brandes, Southbury, both of CT (US); Michael A. Tischler, Phoenix, AZ (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 09/339,510

(22) Filed: Jun. 24, 1999

(51) Int. Cl.[7] .............................. B32B 18/00; C30B 29/36
(52) U.S. Cl. .................... 428/698; 428/446; 428/699; 428/700; 117/2; 117/88; 117/951
(58) Field of Search ..................................... 428/698, 699, 428/700, 446, 450; 117/951, 2, 88; 423/345

(56) References Cited

U.S. PATENT DOCUMENTS

| | | |
|---|---|---|
| 4,912,064 | 3/1990 | Kong et al. ........................... 437/100 |
| 5,011,549 | 4/1991 | Kong et al. ........................... 148/33.1 |

FOREIGN PATENT DOCUMENTS

| | | | |
|---|---|---|---|
| 409082643A | * | 3/1997 | (JP) . |
| 411121748A | * | 4/1999 | (JP) . |
| 02000001398A | * | 1/2000 | (JP) . |

OTHER PUBLICATIONS

S. Scharnholz, et al, "Dependence of channel mobility on the surface step orientation in planar 6H–SiC MOSFETs", Materials Science Forum, 1998, vol. 264–268, pp. 1001–1004.

V. J. Jennings, et al, "The epitaxial growth of silicon carbide", J. Electrochem. Soc., 1966, vol. 113, pp. 728–731. (No month).

S. Nishino, et al, "Growth and morphology of 6H–SiC epitaxial layers by CVD", J. Crystal Growth, 1978, vol. 45, pp. 144–149. (No month).

N. Kuroda, et al, "Step–controlled VPE growth of SiC single crystals at low temperatures", Ext. Abstr. The 19$^{th}$ Conf. On Solid State Devices and Materials (Tokyo, 1987) pp. 227–230. (Aug. 1987).

H. S. Kong, et al., "Chemical vapor deposition and characterization of 6H–SiC thin films on off–axis 6H–SiC substrates", J. Appl. Phys. 1988, vol. 64, pp. 2673–2679. (Sep. 1998).

A. A. Burk, et al, "SiC expitaxial growth on a–axis SiC substrates" Inst. Phys., Conf. Ser. 1993, vol. 137, pp. 29–32. (No month).

A. Yamashita, et al, "Homoepitaxial chemical vapor deposition of 6H–SiC at low temperatures on {0114} substrates", Jpn. J. Appl. Phys. 1992, vol. 31, pp. 3655–3661. (No month).

W. Si, et al, "Investigations of 3C–SiC inclusions in 4H–SiC epilayers on 4H–SiC single crystal substrates", J. Electronic Matl. 1997, vol. 26, pp. 151–159. (No month).

S. Karmann, et al., "Chemical vapor deposition and characterization of undoped and nitrogen doped single crystalline 6H–SiC", J. Appl. Phys. 1992, vol. 72, pp. 5437–5442. (Dec. 1992).

(List continued on next page.)

Primary Examiner—Deborah Jones
Assistant Examiner—Stephen Stein
(74) Attorney, Agent, or Firm—Robert A. McLauchlin, III; Steven J. Hultquist (57) ABSTRACT

A silicon carbide epitaxial film, grown on an offcut surface of a SiC crystalline substrate of hexagonal crystal form, having an offcut angle of from about 6 to about 10 degrees, toward the <1$\bar{1}$00> crystalline direction of the substrate. The resultant silicon carbide epitaxial film has superior morphological and material properties.

64 Claims, 5 Drawing Sheets

OTHER PUBLICATIONS

T. Ueda, et al, "Crystal growth of SiC by step–controlled epitaxy", J. Crystal Growth 1990, vol. 104, pp. 695–700. (No month).

T. Kimoto, et al, "Step bunching in chemical vapor deposition of 6H– and 4H– SiC on vicinal SiC (0001) faces", Appl. Phys. Lett. 1995, vol. 66, pp. 3645–3647. (Jun. 1995).

Henzler, "Leed studies of surface imperfections" 1962, Appl. Surf. Sci. vol. 11/12, pp. 450–469. (No month).

Larkin et al. "Site competition epitaxy for superior silicon carbide electronics" Appl. Phys. Lett. 1994, vol. 65, pp. 1659–1661. (Sep. 1994).

Lucovsky et al. "Bonding constraints and defect formation at interfaces between crystalline silicon and advanced single layer and composite gate dielectrics" Appl. Phys. Lett., 1999, vol. 74(14), pp. 2005–2007. (Apr. 1999).

Powell, J.A., "Controlled growth of 3C–SiC and 6H–SiC films on low–tilt–angle vicinal (0001) 6H–SiC wafers" Appl. Phys. Lett. 1991, vol. 59 (3) pp. 333–335. (Jul. 1991).

Kimoto, et al., "Surface kinetics of adatoms in vapor phase epitaxial growth of SiC on 6H–SiC {0001} vicinal surfaces" J. Appl. Phys. vol. 65 (2), 1994, pp. 850–858. (Jan. 1994).

Wang, et al., "Effect of substrate orientation on interfacial and bulk character of chemically vapor deposited Monocrystalline silicon carbide thin films" J. Am. Ceram. Soc., 1990, vol. 73, (5) pp. 1289–1296. (No month).

Powell et al., "Process–induced morphological defects in epitaxial CVD silicon carbide", Phys. Stat. Sol. (b), 1997, vol. 202, pp. 529–548. (No month).

\* cited by examiner

SILICON CARBIDE EPITAXIAL LAYERS GROWN ON SUBSTRATES OFFCUT TOWARDS <1+e,OVS 1+ee 00>

GOVERNMENT RIGHTS IN INVENTION

This invention was made with Goverment support under: Contract No. NAS3-97095 awarded by the U.S. National Aeronautics and Space Agency; Contract No. F33615-97-C-2771 awarded by the Air Force; and Contract No. F33615-95-C-2514 awarded by the U.S. Ballistic Missile Defense Organization (BMDO). The Government has certain rights in this invention.

BACKGROUND OF THE INVENTION

1. Field of the Invention

This invention relates to silicon carbide (SiC) epitaxial layers grown on substrates offcut towards <1$\bar{1}$00>, to devices comprising Such SiC epitaxial layers, and to a method of making such SiC epitaxial layers.

2. Description of the Related Art

High doping concentrations are required to form low specific contact resistances in SiC ohmic contacts. Low ohmic contact resistances improve the performance of SiC devices. Conventional SiC homoepitaxy is performed on SiC substrates offcut towards the <11$\bar{2}$0> crystalline direction. N-type doping concentrations are typically in the range of $10^{18}$ atoms $cm^{-3}$, with some reports describing doping levels $>10^{19}$ atoms·$cm^-$, but higher doping concentrations and more efficient dopant incorporation (of both n-type and p-type dopants) are desired. Epilayers may offer lower defect densities and more controlled doping compared to substrate doping or dopant implantation into the substrate.

It is also desirable to provide a more uniform surface structure on the epitaxial layer surface. A uniform surface should facilitate the desired removal of material during device fabrication. A uniform epitaxial structure increases the ability to accurately predict how much material is removed during etching, and both the inter-wafer and the run-to-run etching variations are reduced. Smooth and uniform surfaces, especially in cases such as evaporated Schottky contact metals, will lead to improved device performance.

It is also desirable to have a more uniform surface to facilitate oxide fornation and to reduce the density of interface trap states. Further, a more uniform epitaxial surface may reduce surface disparities that can lead to undesirable electric field emitter sites and ultimately premature oxide breakdown. Improved oxide properties will lead to improved device and passivation performance.

In SiC MOSFETs, the epitaxial layer comprising the channel can be polished to remove the steps on the surface that alter channel mobility (see S. Scharnholz, E. Stein von Kamienski, A. Golz, C. Leonhard, and H. Kurz, Material Science Forum, 264–268, 1001 (1998)). The polish will be more uniform with a more uniform step structure, and MOS performance will improve. The zig-zagged step structure found on SiC offcut towards the <11$\bar{2}$0> is also likely to have a higher density of bonding disparities including dangling bonds that may cause high interface trap densities. Additionally, the large surface area exposed to ambient on the zig-zagged <11$\bar{2}$0> -offcut epitaxial surface may make this surface more reactive and prone to undesirable impurity incorporation.

It therefore is an object of the invention to provide an SiC material that minimizes or overcomes the problems of conventional SiC discussed hereinabove.

It is another object of the invention to provide a method of making SiC material of such improved character.

Other objects and advantages of the invention will be more fully apparent from the ensuing disclosure and appended claims.

SUMMARY OF THE INVENTION

The present invention in one aspect relates to an epitaxial SiC film, grown on an offcut surface of a SiC substrate having a hexagonal crystal structure, with the offcut surface having an offcut angle of from about 6 to about 10 degrees, and the crystallographic direction of the offcut surface being towards one of the six equivalent <1$\bar{1}$00> directions of the substrate ±7.5 degrees.

The invention in another aspect relates to a silicon carbide article, comprising:

a SiC substrate of hexagonal crystal form, with an offcut surface having an offcut angle of from about 6 to about 10 degrees, and the crystallographic direction of the offcut surface being towards one of the six equivalent <1$\bar{1}$00 > directions of the substrate ±7.5 degrees; and an epitaxial SiC film, grown on the offcut surface.

The present invention relates in yet another aspect to silicon carbide epitaxial material, grown on a (0001) 4H—SiC crystalline substrate offcut towards the <1$\bar{1}$00> crystalline direction of the substrate.

Figure 2:
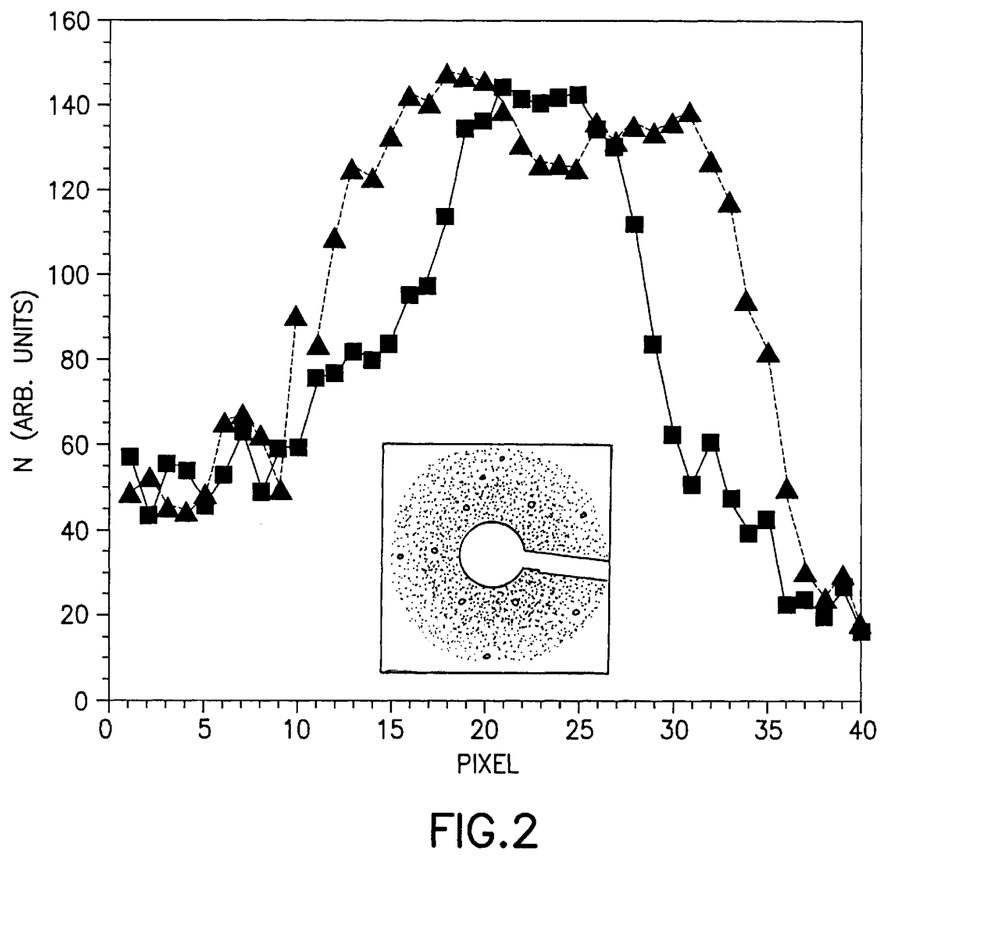
FIG. 2 shows a LEED (0$\bar{1}$)beam intensity profile produced by directing an incident 80 eV beam onto the center (squares) or 1 mm from the edge (triangles) of an 11 $\mu$m thick epilayer grown on 4H—SiC (0001) offcut 8°→<1$\bar{1}$00>, with the inset in FIG. 2 showing a typical 1×1 LEED pattern at $E_r$=80 eV.

The invention relates in another aspect to a 4H—SiC epilayer film grown on a (0001) 4H—SiC substrate offCut towards the <1$\bar{1}$00> crystalline direction of the substrate, wherein the epilayer film has a (0$\bar{1}$) beam intensity profile substantially as shown in FIG. 2, discussed more fully hereinafter.

A further aspect of the invention relates to a 4H—SiC epilayer film grown on a (0001) 4H—SiC substrate offcut towards the <1$\bar{1}$00> crystalline direction of the substrate, wherein the epilayer film has an average root mean square roughness not exceeding about 2.0 nanometers, and preferably less than 1 nanometer.

Another aspect of the invention relates to a silicon carbide article comprising a 4H—SiC epitaxial material on a (0001) 4H—SiC single crystal substrate offcut towards the <1$\bar{1}$00> crystalline direction of the substrate.

A still further aspect of the invention relates to a silicon carbide article comprising a 4—SiC epilayer film grown on a (0001) 4H—SiC substrate offcut towards the <1$\bar{1}$00> crystalline direction of the substrate, and having a LEED (0$\bar{1}$) beam intensity profile substantially as shown in FIG. 2 hereof.

In a still further aspect, the invention relates to a silicon carbide article comprising a 4H—SiC epilayer film grown on a (0001) 4H—SiC substrate offcut towards the <1$\bar{1}$00> crystalline direction of the substrate, and having an average root mean square roughness not exceeding about 2.0 nanometers, and preferably less than 1 nanometer.

As used herein, the term "silicon carbide article" includes a silicon carbide epitaxial film on a silicon carbide base material. The silicon carbide base material may constitute a substrate body (e.g., wafer) formed of silicon carbide, or the silicon carbide base material may comprise an intermediate layer on which the silicon carbide epitaxial film is formed, for example as part of a multilayer microelectronic device (e.g., circuit) structure or as a part of some other structural body or form including the silicon carbide epitaxial film on the silicon carbide base material.

Concerning such device applications, the SiC films of the present invention may be employed for a wide variety of microelectronic devices or device precursor structures, including, without limitation, Schottky and p-n diode rectifiers, SiC photo-diodes and SiC light emitting diodes, switching devices, including field effect transistors (e.g., JFET, MOSFET and MESFET devices), monolithic integrated SiC operational amplifier chips, digital logic gates, latches, flip-flops, binary counters, half adder circuits, non-volatile random access memory (NVRAM) arrays and other SiC digital integrated circuits.

A broad method aspect of the invention relates to a method of forming a silicon carbide epitaxial film, comprising depositing such film on a silicon carbide crystalline substrate offcut towards the <1$\bar{1}$00> crystalline direction of the substrate.

In another method aspect, the invention relates to a method of forming a silicon carbide epitaxial film, comprising depositing such film on a (0001) 4H—SiC crystalline substrate offcut towards the <1$\bar{1}$00> crystalline direction of the substrate.

A further method aspect of the invention relates to a method of forming a silicon carbide epitaxial film, comprising growing such film on a (0001) 4H—SiC crystalline substrate offcut towards the <1$\bar{1}$00> crystalline direction of the substrate, wherein the growing step comprises:
   introducing a carrier gas, a vaporized silicon-containing material and a vaporized carbon-containing material into a growth chamber; and
   maintaining the carrier gas, silicon-containing material and carbon-containing material flows and temperature condition for a time sufficient to grow a film of desired thickness.

The silicon-containing material and the carbon-containing material in the above method may comprise a single source material in which the source reagent contains silicon and carbon, in a single compound, adduct or coordination complex.

Other aspects, features and embodiments of the invention will be more fully apparent from the ensuing disclosure and appended claims.

DETAILED DESCRIPTION OF THE INVENTION, AND PREFERRED EMBODIMENTS THEREOF

While the ensuing description of the invention is directed primarily to silicon carbide epitaxial films formed on 4—SiC substrate materials, it will be appreciated that the utility of the invention is not thus limited, and that the invention broadly contemplates the formation of epitaxial silicon carbide on other types of silicon carbide substrates, such as exist in a great variety of hexagonal (H), rhombohedral (R) and cubic (C) crystal forms, among the more than 200 polytypes of silicon carbide. Illustrative polytypes include 4H—SiC, 6H—SiC, 15R—SiC and 3C—SiC. 4H—SiC and 6H—SiC are presently preferred, with 4H—SiC being most preferred.

In this respect, it is to be noted that the offcut epitaxial SiC growth surface is described herein for various hexagonal crystallographic forms of SiC, in corresponding hexagonal directional notation. For other crystalline forms of SiC, e.g., rhombohedral, cubic, etc., suitable offcut surfaces may be analogously described with respect to their planes, angles and directions, in equivalent crystallographic directional notations that are specific to such other crystalline forms.

The present invention contemplates the formation of device quality SiC films on corresponding substrates. In the case of 4H—SiC, the substrate has a planar growth surface (interface) that is offcut, i.e., inclined with respect to the axis of a basal plane thereof, with (I) an angle of inclination between the planar growth surface and the axis of the basal plane (offcut angle) from about 6 to about 10 degrees, more preferably from about 7 to about 9 degrees and most preferably about 8 degrees, and (II) the crystallographic direction of the inclined planar growth surface being towards one of the six equivalent <1$\bar{1}$00>directions of the substrate ±7.5 degrees (i.e., such direction being within an arc range of 15 degrees that is centered on the <1$\bar{1}$00> direction as the midpoint of such range).

The epitaxial SiC film formed on the substrate preferably is an SiC film of the same polytype as the substrate, and the epitaxial film is suitably homoepitaxially deposited on the substrate interface surface.

The silicon carbide films of the present invention possess a smooth surface morphology, within an edge exclusion area (the edge exclusion area generally having an edge thickness dimension on the order of about 3 millimeters). Such smooth surface is characterized by a root mean square roughness not exceeding about 2 nanometers (20 Angstroms) in magnitude, and more preferably such smooth surface has a root mean square roughness of less than about 1 nanometer (10 Angstroms) in magnitude. All root mean square values of surface roughness herein refer to root mean square roughness values as measured on a 20 $\mu$m×20 $\mu$m area using a Digital Instruments Dimension 3000 atomic force microscope with a probe tip radius of 5 nanometers (nm).

Such silicon carbide epitaxial films also have a substantially uniform thickness and a low defect density (it being recognized that different polytypes have differing varieties of and susceptibility to defects; e.g., triangle defects are specific to 4H—SiC) that is compatible with microelectronic device applications. The silicon carbide film is amenable to doping with p-type dopants and/or n-type dopants, which may selectively be incorporated in the film, or selected region(s) thereof, at any suitable dopant concentration, e.g., a concentration of from about $1\times10^{13}$ to about $1\times10^{21}$ atoms·cm$^{-3}$. For example, n-type doping can be carried out using nitrogen as the dopant species and gaseous nitrogen as the dopant source gas. Techniques such as site competition epitaxy can be used to enhance the incorporation of nitrogen so that heavily-doped epitaxial layers can be fabricated, e.g., for ohmic contacts. P-type doping can be carried out using aluminum as the dopant species and trimethylaluminum or triethylaluminum as the dopant source reagent, or alternatively using boron as the dopant species and diborane or other boron-containinig precursor as the dopant source reagent. N-type and p-type doping may be selectively used to form corresponding p-n junctions in the film material.

The present invention overcomes the problems of prior art SiC materials discussed in the Background of the Invention section hereof, by the provision of SiC epitaxial growth on SiC substrates, as more fully shown hereinafter with reference to (0001) 4H—SiC substrates, that are offcut towards the <1$\bar{1}$00> direction instead of the commonly used offcut direction of <11$\bar{2}$0>. Growth on substrates offcut towards the <1$\bar{1}$00> direction of the SiC crystal permits substantially improved morphological and material properties to be achieved in relation to other growth orientations. Such improved properties include a higher level of dopant incorporation, and the formation of a significantly more uniform surface structure facilitating etching, polishing and oxide formation.

By way of further background toward understanding the substantial advance in the art achieved by the present invention, substrate crystalline orientation is a key factor in determining the quality of SiC epitaxial layers formed by chemical vapor phase epitaxy. Early investigation of SiC growth determined that growth on 6H—SiC (0001) substrates yielded 3C—SiC layers riddled with double positioning boundaries (DPB) unless very high growth temperatures (>1500° C.) were used (see V. J. Jennings, A. Sommer, and H. C. Chang, J. Electrochem. Soc. 113, 728 (1966); and S. Nishino, H. Matsunami, and T. Tanaka, J. Crystal Growth 45, 144 (1978)). Subsequent work showed that very high quality homoepitaxial 6H—SiC films could be produced using growth temperatures as low as 1200° C. if the substrate was offcut several degrees from the (0001) plane (see N. Kuroda, K. Shibahara, W. S. Woo, S. Nishino, and H. Matsunami, Ext. Abstr. The 19$^{th}$ Conf. On Solid State Devices and Materials (Tokyo, 1987) p. 227; and H. S. Tong, J. T. Glass, and R. F. Davis, J. Appl. Phys. 64, 2673 (1988)). The offcut produces a series of steps and terraces on the SiC surface that promotes lateral growth (step flow growth). In this manner, the epilayer replicates the stacking order of the substrate, and high quality homoepitaxial growth ensues.

While most of the work in SiC epitaxy has focused on substrates offcut 4–8° towards one of the six equivalent <11$\bar{2}$0> crystalline directions, the effect of alternative substrate offcut directions has remained a critical, but less studied, aspect of SiC epitaxy. Studies of SiC epitaxial growth on alternative substrate orientations have focused on growth on {11$\bar{2}$0}, {1$\bar{1}$00}, or {01$\bar{1}$4} surfaces (see A. A. Burk, D. L. Barret, H. M .Hobgood, R. R. Siergiej, T. T. Braggins, R. C. Clarke, W. G. Eldrige, C. D. Brandt, D. J. Larkin, J. A. Powell, and W. J. Choyke, Inst. Phys., Conf. Ser. 137, 29 (1993); A. Yamashita, W. S. Woo, T. Kimoto, and H. Matsunaini, Jpn. J. Appl. Phys. 31, 3655 (1992); and W. Si, M. Dudley, H.-S. Kong, J. Suimakeris, and C. Carter, J. Electronic Mati. 26, 151 (1997)). Epitaxial growth on 6H—SiC (0001) substrates offcut ≦4° towards the <1$\bar{1}$00> direction (denoted 6H—SiC (0001) offcut X°→<1$\bar{1}$00>) was previously studied, but the surface possessed large-scale step bunching which appeared as striations when viewed using optical microscopy (see S. Karmann, W. Suttrop, A. Schoner, M. Schadt, C. Haberstroh, F. Englebrecht, R. A. Stein, and S. Leibenzeder, J. Appl. Phys. 72, 5437 (1992)) and exhibited degraded morphology compared to material offcut towards <11$\bar{2}$0> (N. Kuroda, et al., ibid.). The striations degraded into rough 3D growth as thicker 10 $\mu$m layers were grown in a similar study (see T. Ueda, H. Nishino, and H. Matsunami, J. Crystal Growth 104, 695 (1990)). The magnitude of the offcut angle also plays a key role in 4H—SiC epilayer growth. Reduction of 3C—SiC triangular inclusions was obtained on substrates offcut 8° from the (0001) plane towards <11$\bar{2}$0> for 4H—SiC liomoepitaxy, compared to substrates offcut by 4° (see A. Yamashita, et al., ibid; J. A. Powell and D. J. Larkin, Phys. Stat. Solidi B 202, 529 (1997) and references therein; and T. Kimoto, A. Itoh, and H. Matsunami, Appl. Phys. Lett. 66, 3645 (1995)).

The present invention embodies the use of silicon carbide substrates, e.g., (0001) SiC substrates, offcut towards the <1$\bar{1}$00> crystalline direction for SiC epitaxial growth. In contrast to the literature in the art to date and the teachings in U.S. Pat. No. 4,912,064 that describe the<11$\bar{2}$0> as the optimal offcut direction for SiC epitaxial growth, we have found that surfaces offcut towards the <1$\bar{1}$00> direction are superior to surfaces offcut towards the <11$\bar{2}$0> direction. More specifically, we have found that device quality SiC films can be readily produced on 4H—SiC substrates characterized by an offcut angle of from about 6 to about 10 degrees, more preferably from about 7 to about 9 degrees, and most preferably about 8 degrees, with the direction of the offcut surface being towards one of the six equivalent <1$\bar{1}$00> directions ±7.5 degrees (preferably ±5 degrees, more preferably ±2.5 degrees, and most preferably ±1.5 degrees.

By way of specific example, high quality 4H—SiC epilayers can be grown on (0001) 4H—SiC substrates offcut 8°→<1$\bar{1}$00>.

The invention permits unexpectedly higher doping levels to be achieved on the <1$\bar{1}$00> offcut epilayers compared to the <11$\bar{2}$0> offcut epilayers for identical doping deposition conditions. Furthermore, a substantially more uniform surface structure is produced, providing correspondingly improved etching, polishing and oxide formation.

Figure 1:
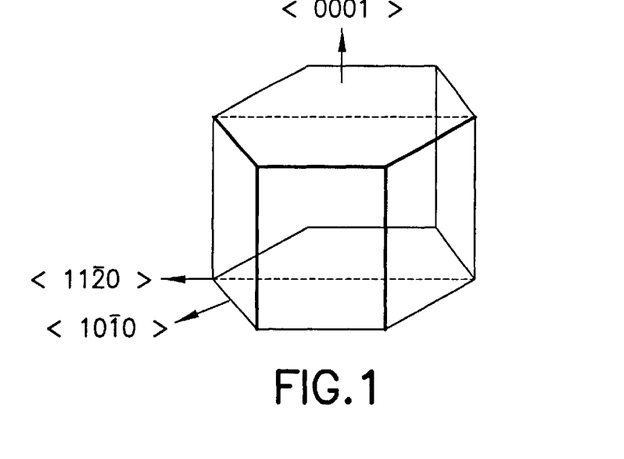
FIG. 1 is a schematic representation of a hexagonal SiC crystal structure showing the respective directions of such crystal structure.

The crystal directions of hexagonal SiC are illustratively shown in FIG. 1 with respect to the <0001> (c-axis) direction. The invention will now be described with reference to the formation of a 4H—SiC epitaxial layer on an offcut (0001) 4H—SiC substrate, in accordance with a preferred embodiment of the invention.

The 4H—SiC epitaxial material of the invention may be formed as a layer on the offcut (0001) 4H—SiC substrate by a growth process in which silicon- and carbon-containing precursor vapor, e.g., deriving from a mixture of silane gas and methane gas, or other silicon and carbon source reagents, optionally and preferably in a carrier gas such as hydrogen, are introduced to the growth chamber containing the offcut (0001) 4H—SiC substrate under appropriate growth conditions, e.g., of flow rates and concentration of the silicon source and carbon source reagents, elevated temperature, and appropriate pressure ranging from atmospheric to subatmospheric pressure (preferably subatmospheric pressure), to produce an epitaxial growth on the offcut growth surface of the substrate.

The epitaxial 4H—SiC material formed on the substrate may be grown to any suitable thickness, e.g., from about 0.002 to 400 micrometers, as may be necessary or desirable in a given application of the method and resultant film material. The film material may be grown to appropriate thickness and utilized on the substrate, or it may be separated from the substrate, e.g., by internal pressure fracturing techniques, etch removal of the substrate, or other suitable procedure, to provide a thin film body of the 4H—SiC material, as a free-standing (self-supporting) entity.

The 4H—SiC epitaxial material of the invention may be doped during its growth by in-situ doping techniques using appropriate n-type and/or p-type dopant species, as appropriate to the desired end use of the epilayer material. Alternatively, the epilayer material may be doped subsequent to its formation, by ion implantation, diffusion or other suitable techniques.

The 4H—SiC epitaxial material of the invention is of superior device quality, and may be used for the fabrication of microelectronic device structures thereon and/or therein, e.g., MOSFETs, other semiconductor device structures, diodes, capacitors, memory cell architectures, etc.

A wide variety of SiC film formation processes may be employed in the broad practice of the invention to form the epitaxial SiC layer on the substrate, including bulk growth techniques, the modified Lely process, epitaxial growth techniques, molecular beam epitaxy, and chemical vapor deposition. The silicon and carbon source reagents may be of any suitable type, e.g., silane as a silicon source reagent, and a hydrocarbon gas such as methane, propane, etc., as the carbon source reagent. It is also possible to utilize a single source reagent, containing both carbon and silicon atoms, as the source material for the silicon carbide film.

Relative to generalized processing techniques and background relating to silicon carbide film and device formation, the disclosures of U.S. Pat. No. 4,912,064 issued Mar. 27, 1990 in the names of H. Kong et al. for "Homoepitaxial growth of alpha-SiC thin films and semiconductor devices fabricated thereon," and U.S. Pat. No. 5,661,074 issued Aug. 26, 1997 in the names of Michael A. Tishchler, et al. for "High brightness electroluminescent device emitting in the green to ultraviolet spectrum and method of making the same" are incorporated herein by reference in their entireties.

In one illustrative embodiment of the invention, 4H—SiC epitaxial films were grown on single crystal 4H—SiC wafers oriented 8±1° from (0001) towards either the <1$\overline{1}$00> or <11$\overline{2}$0>. The films were grown in a horizontal quartz water-cooled reaction chamber, although other reactor configurations are possible. The 4H—SiC films were grown at 100 Torr using dilute $SiH_4$ and $CH_4$ with a $H_2$ carrier gas. As mentioned, other Si- and C-containing precursors can be used to produce the SiC films.

Growth temperatures were typically in the range of 1450–1550° C., and were obtained by placing the wafer on a graphite-based susceptor and heating using RF induction. Many growth system designs are possible, and can be constructed by those skilled in the art of epitaxial growth. Intentional doping was accomplished using $N_2$ gas to provide the n-type dopant (N) and triethylaluminum (TEA) to provide the p-type dopant (Al). Other dopant precursors, including, without limitation, $P_3$, $B_2H_6$, TMA, and various vanadium-containing precursors can also be used.

The specific growth parameters chosen for this illustrative embodiment of the invention were those identified as optimal for growth on 4H—SiC (0001) offcut 8°→<11$\overline{2}$0>; no effort was made to optimize the growth parameters for epitaxial growth on 4H—SiC (0001) offcut 8°→<1$\overline{1}$00>. Suitable process conditions of temperature, pressure, and gas flows can be selected and optimized by those skilled in the art, for the desired epitaxial growth operation.

The results of the above-described growth of SiC included smooth surface morphologies for the 4H—SiC epilayers grown on both substrate orientations. No large-scale step bunching or rough 3D growth was observed, even for epilayers as thick as 15 $\mu$m.

Triangular 3C inclusions, commonly observed in 4H—SiC growth on substrates oriented towards <11$\overline{2}$0>, were observed on epilayers grown on 4H—SiC substrates for both offcut directions. The triangular defect densities were similar on samples with comparable epilayer thicknesses, and were located mainly at the wafer periphery for both offcut directions. The overall triangle defect density was higher ion 4° offcut wafers compared to 8° offcut wafers, regardless of offcut direction.

LEED spot intensity and spot profiles were used to examine the near-surface region of 4H-SiC epitaxial films grown on substrates oriented towards <1$\overline{1}$00>, following the procedure of M. Henzler, Appl. Surf. Sci. 11/12, 450 (1962). Bright, sharp diffraction patterns, indicative of high crystalline quality, are observed; the inset in FIG. 2 shows a typical 1×1 LEED pattern at an incident electron energy of 80 eV. A position-dependent study of the (0$\overline{1}$) beam spot profiles revealed superior crystalline quality across the wafer, degrading only within the 3 mm wafer edge region where the triangular defect density increased.

The LEED (0$\overline{1}$) beam intensity profile of FIG. 2 was produced by directing the incident 80 eV beam onto the center (squares) or 1 mm form the edge (triangles) of an 11 $\mu$m thick epilayer grown on 4H—SiC (0001) offcut 8°→<1$\overline{1}$00>. The inset in FIG. 2 shows a typical 1×1 LEED pattern at $E_i$=80 eV.

Atomic force microscopy (AFM) analysis revealed that 4H—SiC epitaxial films grown on substrates offcut towards either <11$\overline{2}$0> or <1$\overline{1}$00> were very smooth, exhibiting an average RMS roughness that was always less than 0.8nm (400 $\mu m^2$ scan area). Over 20 <1$\overline{1}$00> oriented epilayers were studied using AFM; a data analysis is set out hereinafter for a typical subset of these growths. The RMS roughness for epilayers grown during the same growth run on both offcut directions were similar for comparable film thickness and scan size, increasing only slightly with increasing epilayer thickness.

The variation in the RMS roughness measured across the wafer was smaller for epilayers grown on substrates offcut towards <1$\overline{1}$00>. Films grown on substrates oriented towards <1$\overline{1}$00> possessed a regular, parallel and distinct step structure whereas films grown on substrates oriented towards <11$\overline{2}$0> exhibited a more irregular step structure. The direction of the steps on both offcut orientations was parallel to the offcut direction, consistent with step flow growth.

After taking into account the 5 nm probe tip radius, an analysis of the step heights (both offcut directions) revealed that the most common step height was 0.5 nm, equal to two Si-C bilayers or half the 4H unit cell height. Steps of 4 Si—C bilayers were also observed, but with less frequency than observed on epilayers grown on 4H—SiC (0001) offcut 3.5°→<11$\overline{2}$0> (epilayers grown on 4H—SiC (0001) offcut 3.5°→<11$\overline{2}$0> are described in T. Kimoto, A. Itoh, and H. Matsunami, Appl. Phys. Lett. 66, 3645 (1995)). No evidence of larger scale step bunching could be seen when the AFM scan areas were increased.

Table 1shows the average RMS and doping concentration (CV) for different thickness intentionally n-type 4H—SiC epilayers grown using identical conditions on substrates offcut 8° toward <1$\overline{1}$00> or <11$\overline{2}$0>. The RMS average and standard deviations, shown in parentheses, were calculated from three random measurements on the wafer. Where no deviation value is presented, the RMS value is from a single point measurement near the center of the wafer. Epilayers of the same thickness were grown during the same growth run.

TABLE I

|  | 3 µm | | 5 µm | | 15 µm | |
| --- | --- | --- | --- | --- | --- | --- |
|  | <1$\bar{1}$00> | <11$\bar{2}$0> | <1$\bar{1}$00> | <11$\bar{2}$0> | <1$\bar{1}$00> | <11$\bar{2}$0> |
| RMS (nm) 0.5 × 0.5 µm² | 0.12 | 0.16 | 0.14 (0.02) | 0.13 (0.02) | 0.20 (0.01) | 0.14 (0.01) |
| RMS (nm) 20 × 20 µm² | 0.23 | 0.55 | 0.37 (0.02) | 0.27 (0.06) | 0.77 (0.12) | 0.68 (0.21) |
| $N_d$ ($10^{16}$ cm⁻³) | 5 | 4 | 6 | 5 | 9 | 6 |

Figure 3:
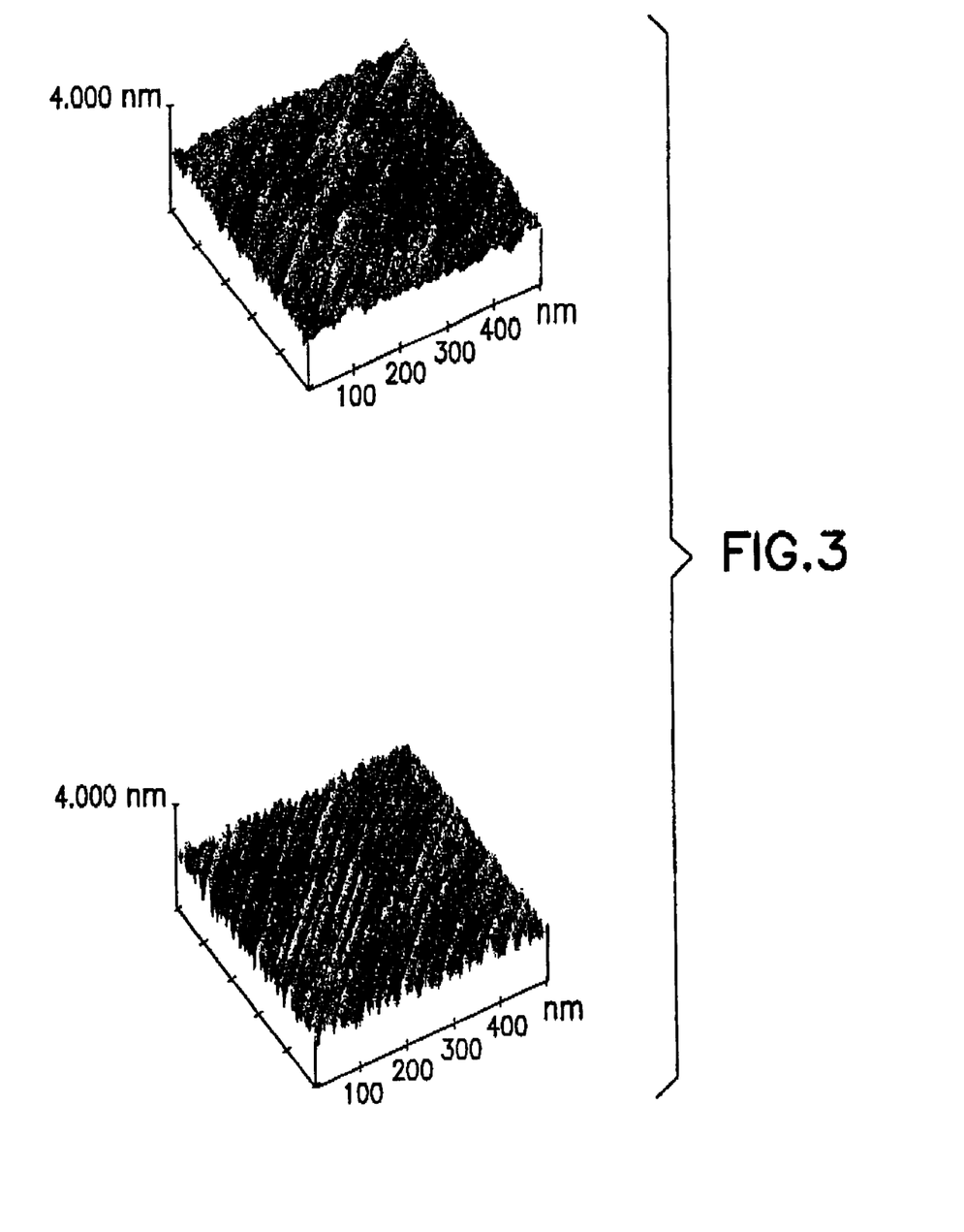
FIG. 3 shows the AFM scan for an epilayer grown on 4H—SiC (0001) offcut 8°→<11$\bar{2}$0>.
Figure 4A:
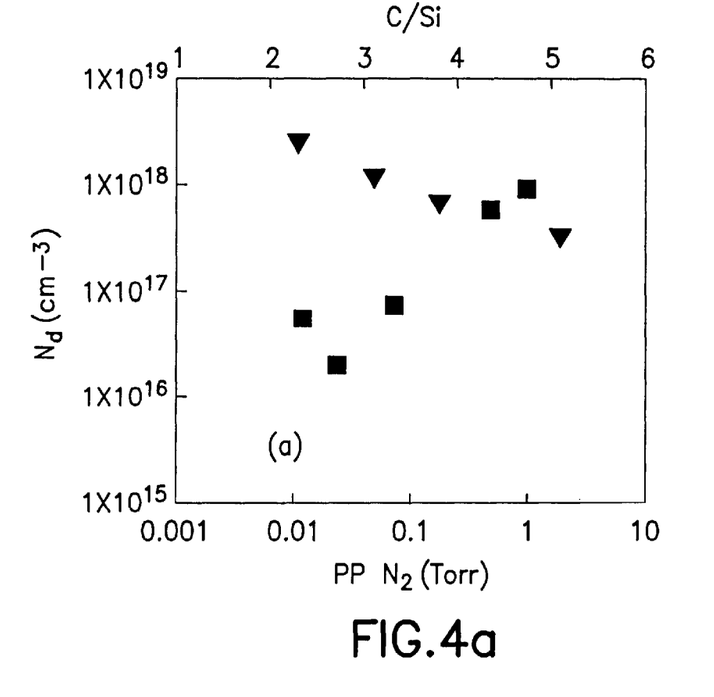
FIG. 4 shows an AFM scan for an epilayer grown on 4H—SiC (0001) offcut 8°→<1$\bar{1}$00>.
Figure 4B:
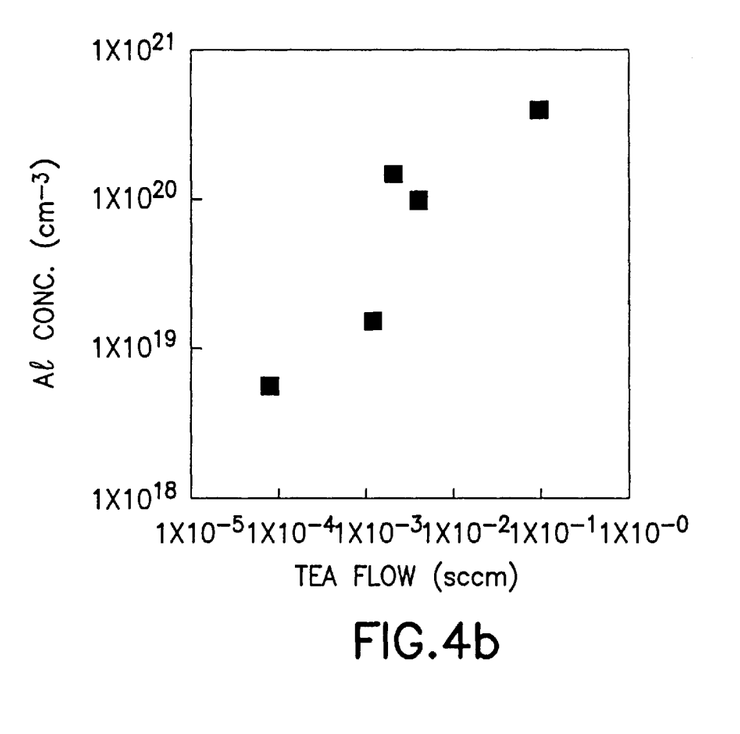

AFM scans are shown in FIG. 3 and FIG. 4 for 500×500 nm² areas of 15.5 µm thick 4H—SiC epilayers grown during the same growth run. Height scale on both profiles is 2 nm/division. FIG. 3 shows the AFM scan for an epilayer grown on 4H—SiC (0001) offCut 8° towards <11$\bar{2}$0>, while FIG. 4 shows an AFM scan for an epilayer grown on 4H—SiC (0001) offcut 8° towards <11$\bar{2}$0>.

In addition to good film quality, it was found that the n-type dopant incorporation was higher for films grown on substrates offcut towards the <1$\bar{1}$00> compared to films grown on wafers offcut towards <11$\bar{2}$0> for identical growth conditions. Table I also shows the donor concentrations ($N_d$) for films grown on both orientations. SIMS analysis of these samples agreed well with the CV results, indicating comparable activations for the two orientations. Additional experiments also confirmed the trend of high doping levels on substrates offcut towards <1$\bar{1}$00>.

Figure 5:
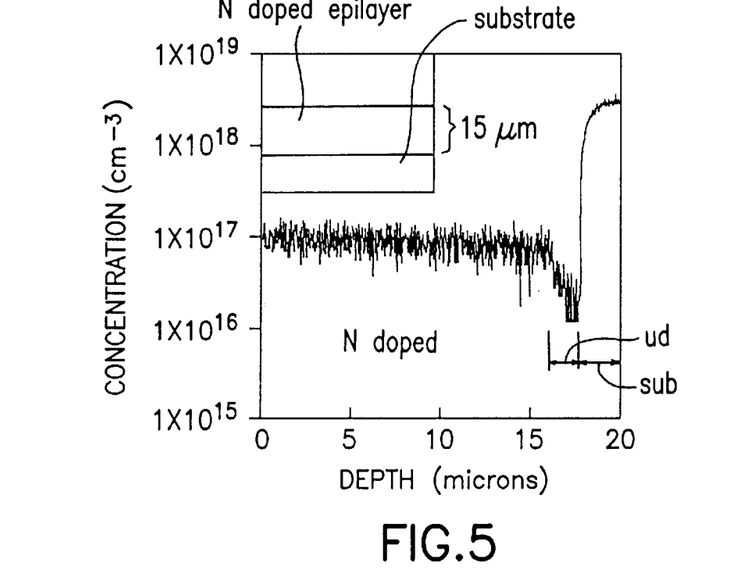
FIG. 5 shows variation of donor concentration measured by CV analysis via variation of C/Si (constant partial pressure $N_2$, triangles) and variation of partial pressure $N_2$ (constant C/Si, squares) for films grown on 4H—SiC (0001) offcut 8°→<1$\bar{1}$00>.
Figure 6:
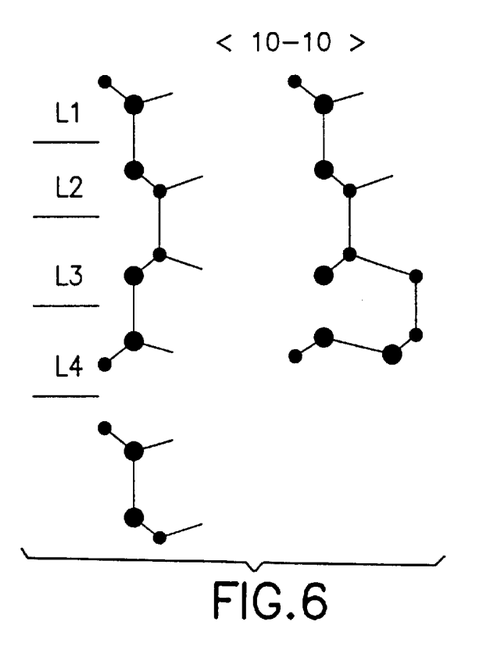
FIG. 6 shows variation of Al concentration (SIMS analysis) via variation of TEA flow for films grown on 4H—SiC (0001) offcut 8°→<1$\bar{1}$00>.

It is important to note that while the overall doping level is higher on <1$\bar{1}$00> -offcut epilayers of the present invention, doping control can be readily achieved using conventional techniques for such films. FIGS. 5 and 6 show doping control in 4H—SiC epilayers grown on substrates offcut 8°→<1$\bar{1}$00>.

FIG. 5 shows n-type doping control both by variation of input nitrogen partial pressure and by site competition epitaxy (C/Si ratio variation) for 4H—SiC epilayers grown on substrates offcut 8° towards <11$\bar{2}$0 >. The n-type doping density increases with increased input $N_2$ partial pressure as expected. The n-type doping density decreases with increasing C/Si, as expected by the "site competition" model developed by Larkin et a/. (D. J. Larkin, P. G. Neudeck, J. A. Powell, and L. G. Matus, Appl. Phys. Lett. 65, 1659 (1994)). P-type (Al) doping control via TEA flow variation is also demonstrated in FIG. 6 for films grown on (0001) 4H—SiC substrates offcut 8°→<1$\bar{1}$00>.

Figure 7:
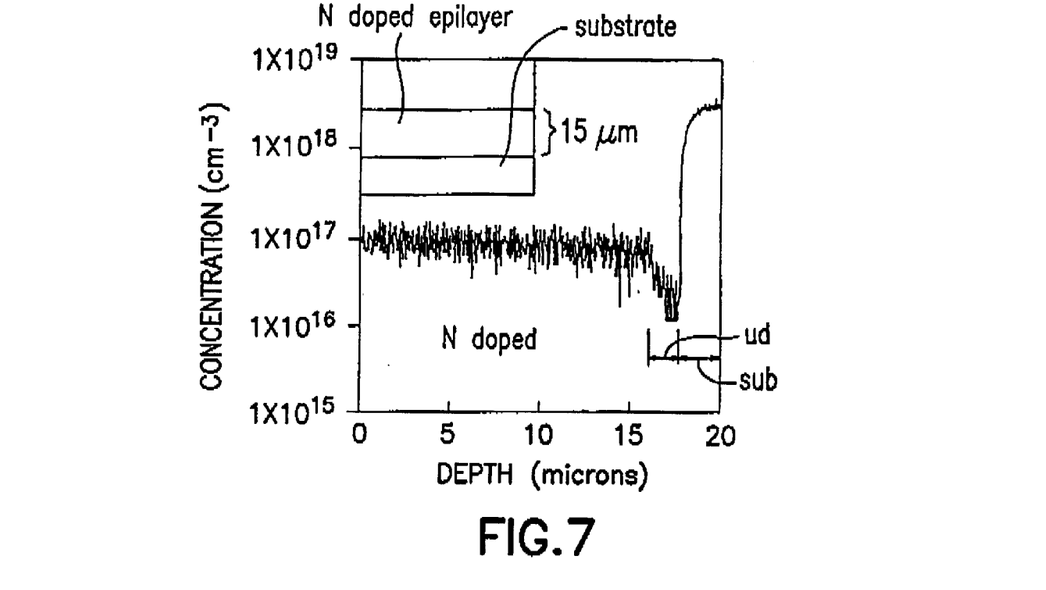
FIG. 7 shows a SIMS nitrogen profile of a 15.5 $\mu$m thick epilayer grown on 4H—SiC (0001) offcut 8°→<1$\bar{1}$00>.

Doping control within the epilayer was also demonstrated for 4H—SiC epilayers grown on substrates offcut 8°→< 1$\bar{1}$00>. FIG. 7 shows the SIMS N profile of a 14 µm thick lightly doped layer on a 1.5 µm ulidoped buffer (N detection limit is 2×10¹⁶ cm⁻³). The N level remains constant throughout the epilayer, and the undoped layer is clearly seen. The N doped region, the undoped region (ud) and the substrate (sub) are marked. The inset shows a SEM micrograph of the film cross section.

Figure 8:
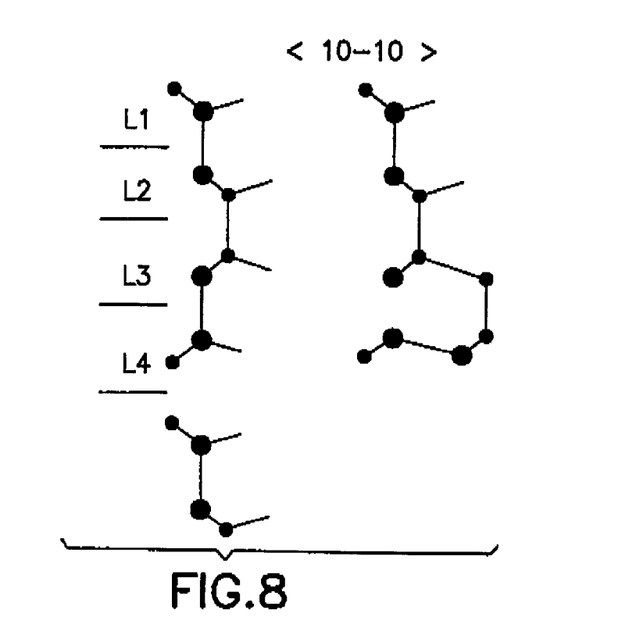
FIG. 8 shows the bonding configuration of the <1$\bar{1}$00> surface of a (000 1) 4H—SiC material.

While we do not wish to be bound by a theory as regards the mechanism or basis of the improvement in doping character realized in the practice of the present invention, it is possible that the higher doping level in this offcut orientation may be explained by the surface bonding configuration. FIG. 8 shows the bonding configuration of the <1$\bar{1}$00> surface. In previous work by Burk el oil., SiC epilayers were grown on on-axis <11$\bar{2}$0> and <1$\bar{1}$00> SiC substrates. The unintentional n-type doping was almost an order of magnitude higher on <11$\bar{2}$0> orientation compared to the c-axis wafers, while the <1$\bar{1}$00> epilayers contained about two orders of magnitude higher doping than the <11$\bar{2}$0> epilayers (10¹⁸ cm⁻³ range). They also noted a shift towards n-type doping for a-axis as compared to c-axis epilayers when intentional n- and p-type dopants were added. They were able to control the doping using site competition. In our own work we have used the more typical c-axis SiC substrate, and altered the offcut direction. Our unintentional n-type concentrations were <2×10¹⁶ cm⁻³ (SIMS detection limit). We were able to obtain n- and p-type doping control over five orders of magnitude when <1$\bar{1}$00>-offcut substrates were used. Intentional n-type doping levels as low as 1×10¹⁵ cm⁻³ have also been achieved.

There are various advantages to growing SiC epilayers on substrates offcut toward the <11$\bar{2}$0> direction. Higher n-type doping levels can be achieved for 4H—SiC epilayers grown on substrates offcut 8°<1$\bar{1}$00>, compared to 4H—SiC epilayers grown on substrates offcut 8°→<11$\bar{2}$0>, at the same gas ratio. The resultant higher doping concentrations on the 4H—SiC epilayers grown on substrates offcut 8°→<1$\bar{1}$00> lead to the formation of ohmic contacts with lower contact resistance. In epitaxial growth on 4H—SiC (0001) offcut toward <11$\bar{2}$0>, an additional donor implantation step to reduce the contact resistance is required, and growth on the <1$\bar{1}$00> orientation may eliminate the need for this additional step.

Lower contact resistances will improve the performance of a wide variety of devices. For example, the SiC MESFET frequency response will be improved by a reduction in contact-induced parasitic series resistance. Higher n-type doping levels can be achieved using the doping parameters described herein, because of the increased doping efficiency of this orientation. The crystal quality is maintained, and the doping levels can be fully controlled, when the <1$\bar{1}$00> offcut direction is used. The unintentional impurity levels can also be kept sufficiently low to attain the desired doping levels.

The more uniform surface structure evident in FIG. 5 also facilitates the removal of material during device fabrication. The uniform structure increases the ability to accurately predict how much material is removed during etching, and the run-to-run and inter-wafer variation is reduced. Smooth and uniform etched surfaces improve the quality of the device passivation, the performance of etched Schottky contacts, and the overall device performance.

The more uniform, parallel-step surface structure on the <1$\bar{1}$00>-offcut epitaxial surface facilitates high-quality oxide formation by reducing the density of interface trap states. The zig-zagged step structure found on SiC offcut towards the <11$\bar{2}$0> will produce a higher dangling bond density per unit area than the parallel step structure. The step dangling bond density will be ~$\sqrt{2}$× higher on surfaces miscut towards the <11$\bar{2}$0> while the surface dangling bond density will be equal for both. If the oxide interface defect density is taken to be proportional to the dangling bond density, the higher density of dangling bonds will lead to an oxide with a higher interface trap density. Further evidence for this advantage resides in the recent analysis of Lucovsky et al. (Applied Physics Letters 74(14), 2005 (1999)). In the ideal case of a dielectric on semiconductor, the average coordination number is three, a value that correleates with the formation of a very good or excellent oxide (a coordination number greater than three was determined to correlate with poor oxide formation). By adding steps, the coordination number increases at the step. Since the step edge density per unit area is greater on samples miscut towards the <11$\bar{2}$0>, this problem becomes worse, and the coordination number deviates further from the ideal.

Further, the nature of field emission sites below a deposited oxide will be different on surfaces grown on the <11$\bar{2}$0> compared to the <1$\bar{1}$00>. The zig-zagged structure on <11$\bar{2}$0> offcuts produces more deleterious point emitters, while the stepped structure on <1$\bar{1}$00> offcuts produce more desirable edge emitters. Edge emitters emit at a higher field than a comparably high point emitter and consequently, the oxide deposited on the <1$\bar{1}$00> miscut direction surface will require a higher electric field for breakdown. Increased step bunching, even at low numbers of bilayers, e.g., 4 bilayers, may contribute to oxide breakdown. If the step bunching that has been observed on both miscut surfaces for very thick layers causes oxide breakdown, polishing can be effected more uniformly on the <1$\bar{1}$00> surface.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art. The invention therefore is to be broadly construed, consistent with the claims hereafter set forth.

What is claimed is:

1. An epitaxial SiC film, grown on an offcut surface of a SiC substrate having a hexagonal structure, with the offcut surface having an offcut angle of from about 2 to about 10 degrees, and the crystallographic direction of the offcut surface being towards one of the six equivalent <1$\bar{1}$00> directions of the substrate ±7.5 degrees, wherein said epitaxial SiC film comprises a device quality SiC film having a smooth surface morphology, within an edge exclusion area, and having a root mean square roughness not exceeding about 2 nanometers in a 20×20 $\mu m^2$ area.

2. The epitaxial SiC film of claim 1, wherein the SiC substrate comprises 4H—SiC.

3. The epitaxial SiC film of claim 1, wherein the SiC substrate comprises 6H—SiC.

4. The epitaxial SiC film of claim 1, wherein said epitaxial SiC film has a root mean square roughness of less than 1 nanometer in a 20×20 $\mu m^2$ area.

5. The epitaxial SiC film of claim 1, wherein the offcut angle is from about 7 to about 9 degrees.

6. The epitaxial SiC film of claim 1, wherein the offcut angle is about 8 degrees.

7. The epitaxial SiC film of claim 1, wherein the offcut direction is towards one of the six equivalent <1$\bar{1}$00> directions ±5 degrees.

8. The epitaxial SiC film of claim 1, wherein the offcut direction is towards one of the six equivalent <1$\bar{1}$00> directions ±2.5 degrees.

9. The epitaxial SiC film of claim 1, wherein the offcut direction is towards one of the six equivalent <1$\bar{1}$00> directions ±1.5 degrees.

10. The epitaxial SiC film of claim 1, doped with an n-type and/or p-type dopant species.

11. The epitaxial SiC film of claim 1, doped with an n-type dopant species and/or a p-type dopant species.

12. The epitaxial SiC film of claim 1, doped with a dopant species at a dopant concentration of from about $1\times10^{13}$ to about $1\times10^{21}$ atoms·cm$^{-3}$.

13. The epitaxial SiC film of claim 1, doped with a dopant species at a dopant concentration of from about $1\times10^{18}$ to about $1\times10^{21}$ atoms·cm$^{-3}$.

14. The epitaxial SiC film of claim 1, doped with a dopant species at a dopant concentration of from about $1\times10^{19}$ to about $1\times10^{21}$ atoms·cm$^{-3}$.

15. The epitaxial SiC film of claim 1, having a microelectronic device structure formed on or in the film.

16. The epitaxial SiC film of claim 1, wherein said epitaxial SiC film has no large-scale step bunching.

17. A silicon carbide article, comprising:
   a SiC substrate of hexagonal crystal form, with an offcut surface having an offcut angle of from about 2 to about 10 degrees, and the crystallographic direction of the offcut surface being towards one of the six equivalent <1$\bar{1}$00> directions of the substrate ±7.5 degrees; and
   an epitaxial SiC film, grown on the offcut surface, wherein said epitaxial SiC film comprises a device quality epitaxial SiC film having a smooth surface morphology, within an edge exclusion area, and having a root mean square roughness of not exceeding 2 nanometers in a 20×20 $\mu m^2$ area.

18. The silicon carbide article of claim 17, wherein the SiC substrate comprises 4H—SiC.

19. The silicon carbide article of claim 17, wherein the SiC substrate comprises 6H—SiC.

20. The silicon carbide article of claim 17, wherein the epitaxial SiC film has a root mean square roughness of less than 1 nanometers in a 20×20 $\mu m^2$ area.

21. The silicon carbide article of claim 17, wherein the offcut angle is from about 7 to about 9 degrees.

22. The silicon carbide article of claim 17, wherein the offcut angle is about 8 degrees.

23. The silicon carbide article of claim 17, wherein the offcut direction is towards one of the six equivalent <1$\bar{1}$00> directions ±5 degrees.

24. The silicon carbide article of claim 17, wherein the offcut direction is towards one of the six equivalent <1$\bar{1}$00> directions ±2.5 degrees.

25. The silicon carbide article of claim 17, wherein the offcut direction is towards one of the six equivalent <1$\bar{1}$00> directions ±1.5 degrees.

26. The silicon carbide article of claim 17, wherein the epitaxial SiC film is doped with an n-type and/or p-type dopant species.

27. The silicon carbide article of claim 17, wherein the epitaxial SiC film is doped with an in-type dopant species and/or a p-type dopant species.

28. The silicon carbide article of claim 17, wherein the epitaxial SiC film is doped with a dopant species at a dopant concentration of from about $1\times10^{13}$ to about $1\times10^{21}$ atoms·cm$^{-3}$.

29. The silicon carbide article of claim 17, wherein the epitaxial SiC film is doped with a dopant species at a dopant concentration of from about $1\times10^{18}$ to about $1\times10^{21}$ atoms·cm$^{-3}$.

30. The silicon carbide article of claim 17, wherein the epitaxial SiC film is doped with a dopant species at a dopant concentration of from about $1\times10^{19}$ to about $1\times10^{21}$ atoms·cm$^{-3}$.

31. The silicon carbide article of claim 17, comprising a microelectronic device structure formed on or in the epitaxial SiC film.

32. A silicon carbide epitaxial material, grown on a (0001) 4H—SiC crystalline substrate offcut towards the <1$\bar{1}$00> crystalline direction of the substrate, wherein said silicon carbide epitaxial material has a smooth surface morphology, within an edge exclusion area, and having a root mean square roughness not exceeding about 2 naniometers in a 20×20 $\mu m^2$ area.

33. The silicon carbide epitaxial material of claim 32, wherein the (0001) 4H—SiC crystalline substrate has an offcut angle of from about 7 to about 9 degrees towards the <1$\bar{1}$00> crystalline direction of the substrate.

34. The silicon carbide epitaxial material of claim 32, wherein the (0001) 4H—SiC crystalline substrate has an offcut angle of about 8 degrees towards the <1$\bar{1}$00> crystalline direction of the substrate.

35. The silicon carbide epitaxial material of claim 32, doped with an n-type and/or a p-type dopant species at a dopant concentration of from about $1 \times 10^{18}$ to about $1 \times 10^{21}$ atoms·cm$^{-3}$.

36. A 4H—SiC epilayer film grown on a (0001) 4H—SiC substrate offcut towards the <1$\bar{1}$00> crystalline direction of the substrate, wherein said epilayer film has a LEED (0$\bar{1}$) beam intensity profile as shown in FIG. 2.

37. A 4H—SiC epilayers film grown on a (0001) 4H—SiC substrate offcut towards the <1$\bar{1}$00> crystalline direction of the substrate, wherein said epilayers film has an average root mean square roughness less than 0.8 nanometers in a 20×20 µm$^2$ area.

38. A silicon carbide article comprising a 4H—SiC epitaxial material on a (000$\underline{1}$) 4H—SiC single crystal substrate offcut towards the <1$\bar{1}$00> crystalline direction of the substrate, wherein said 4H—SiC epitaxial material has a smooth surface morphology, within an edge exclusion area, and having a root mean square roughness not exceeding about 2 nanometers in a 20×20 µm$^2$ area.

39. The silicon carbide article of claim 38, wherein the (0001) 4H—SiC single crystal substrate has an offcut angle of from about 7 to about 9 degrees towards the <1$\bar{1}$00> crystalline direction of the substrate.

40. The silicon carbide article of claim 38, wherein the (0001) 4H—SiC single crystal substrate has an offcut angle of about 8 degrees towards the <1$\bar{1}$00> crystalline direction of the substrate.

41. The silicon carbide article of claim 38, wherein the 4H—SiC epitaxial material is doped with an n-type and/or a p-type dopant species at a dopant concentration of from about $1 \times 10^{18}$ to about $1 \times 10^{21}$ atoms·cm$^{-3}$.

42. A silicon carbide article comprising a 4H—SiC epilayer film growing on a (0001) 4H—SiC substrate offcut towards the <1$\bar{1}$00> crystalline direction of the substrate, having a LEED (0$\bar{1}$) beam intensity profile as shown in FIG. 2.

43. A silicon carbide article comprising a 4H—SiC epilayers film grown on a (0001) 4H—SiC substrate offcut towards the <1$\bar{1}$00> crystalline direction of the substrate, having an average root mean square roughness less than about 0.8 nanometers in a 20×20 µm$^2$ area.

44. A method of forming a device quality silicon carbide epitaxial film, comprising depositing said film at subatmospheric pressure conditions on a silicon carbide substrate of hexagonal crystal form, offcut towards the <1$\bar{1}$00> crystalline direction of the substrate, wherein said silicon carbide epitaxial film has a smooth surface morphology, within an edge exclusion area, and has a root mean square roughness not exceeding about 2 nanometers in a 20×20 µm$^2$ area.

45. The method of claim 44, wherein the silicon carbide substrate comprises 4H—SiC.

46. The method of claim 44, wherein the silicon carbide substrate comprises 6H—SiC.

47. The method of claim 44, wherein the offcut angle is from about 7 to about 9 degrees.

48. The method of claim 44, wherein the offcut angle is about 8 degrees.

49. The method of claim 44, wherein the offcut direction is towards one of the six equivalent <1$\bar{1}$00> directions ±5 degrees.

50. The method of claim 44, wherein the offcut direction is towards one of the six equivalent <1$\bar{1}$00> directions ±2.5 degrees.

51. The method of claim 44, wherein the offcut direction is towards one of the six equivalent <1$\bar{1}$00> directions ±1.5 degrees.

52. The method of claim 44, further comprising doping the silicon carbide epitaxial film with an n-type and/or p-type dopant species at a dopant concentration of from about $1 \times 10^{17}$ to about $1 \times 10^{21}$ atoms·cm$^{-3}$.

53. The method of claim 52, wherein the silicon carbide epitaxial film is doped to a dopant concentration of from about $1 \times 10^{19}$ to about $1 \times 10^{21}$ atoms·cm$^{-3}$.

54. A method of forming a device quality silicon carbide epitaxial film, comprising depositing said film at subatmospheric pressure conditions on a (0001) 4H—SiC crystalline substrate offcut towards the <1$\bar{1}$00> crystalline direction of the substrate, wherein said silicon carbide epitaxial film has a smooth surface morphology, within an edge exclusion area, and has a root mean square roughness not exceeding about 2 nanometers in a 20×20 µm$^2$ area.

55. The method of claim 54, wherein the (0001) 4H—SiC single crystal substrate has an offcut angle of from about 7 to about 9 degrees towards the <1$\bar{1}$00> crystalline direction of the substrate.

56. The method of claim 54, wherein the (0001) 4H—SiC single crystal substrate has an offcut angle of about 8 degrees towards the <1$\bar{1}$00> crystalline direction of the substrate.

57. The method of claim 54, wherein growth of said film is carried out using SiH$_4$ and C$_4$ with a H$_2$ carrier gas as a gaseous source medium for said film deposition.

58. The method of claim 57, wherein growth of said film is carried out under growth conditions including temperature in the range of from about 1450 to about 1650° C.

59. The method of claim 57, wherein intentional in-situ doping of said film is carried out during growth of said film.

60. The method of claim 59, wherein doping is conducted with a dopant source for a dopant species selected from the group consisting of nitrogen, aluminum, phosphorus, boron, and vanadium.

61. The method of claim 59, wherein doping is conducted using N$_2$ gas to provide nitrogen as an in-type dopant of the film.

62. The method of claim 59, wherein doping is conducted using triethylaluminum to provide aluminum as a p-type dopant of the film.

63. The method of claim 54, including the step of fabricating an electronic device on the film.

64. A method of forming a device quality silicon carbide epitaxial film, comprising growing said film on a (0001) 4H—SiC crystalline substrate offcut towards the <1$\bar{1}$00> crystalline direction of the substrate, wherein said growing step comprises:

introducing, a carrier gas, a vaporized silicon-containing material and a vaporized carbon-containing material into a growth chamber at subatmosphieric pressure conditions; and maintaining the carrier gas, silicon-containinig material and carbon-containing material flows and temperature condition for a time sufficient to grow a film of desired thickness, wherein said film has a smooth surface morphology, within an edge exclusion area, and has a root mean square roughness not exceeding about 2 nanometers in a 20×20 µm$^2$ area.

* * * * *

UNITED STATES PATENT AND TRADEMARK OFFICE
CERTIFICATE OF CORRECTION

PATENT NO. : 6,329,088 B1
DATED : December 11, 2001
INVENTOR(S) : Landini et al.

It is certified that error appears in the above-identified patent and that said Letters Patent is hereby corrected as shown below:

Column 1,
Line 4, please delete the paragraph pertaining to the Government Support and replace with the insertion of the following text:

-- GOVERNMENT RIGHTS IN INVENTION
This invention was made with the support of the U.S. Government under: Contract No. N00014-93-C-0264 awarded by the Office of Naval Research, Contract No. NAS3-97095 awarded by the U.S. National Aeronautics and Space Agency; Contract No. F33615-97-C-2771 awarded by the Air Force; and Contract No. F33615-95-C-2514 awarded by the U.S. Ballistic Missile Defense Organization (BMDO). The Government has certain rights in this invention. --

Signed and Sealed this

Eleventh Day of June, 2002

Attest:

Attesting Officer

JAMES E. ROGAN
*Director of the United States Patent and Trademark Office*

UNITED STATES PATENT AND TRADEMARK OFFICE
CERTIFICATE OF CORRECTION

PATENT NO. : 6,329,088 B1 Page 1 of 1
DATED : December 11, 2001
INVENTOR(S) : Landini et al.

It is certified that error appears in the above-identified patent and that said Letters Patent is hereby corrected as shown below:

Column 1,
Line 5, please delete the paragraph pertaining to the Government Support and replace with the insertion of the following text:

-- GOVERNMENT RIGHTS IN INVENTION
This invention was made with the support of the U.S. Government under: Contract No. N00014-96-C-0254 awarded by the Office of Naval Research, Contract No. NAS3-97095 awarded by the U.S. National Aeronautics and Space Agency; Contract No. F33615-97-C-2771 awarded by the Air Force; and Contract No. F33615-95-C-2514 awarded by the U.S. Ballistic Missile Defense Organization (BMDO). The Government has certain rights in this invention. --

Signed and Sealed this

Sixth Day of May, 2003

JAMES E. ROGAN
*Director of the United States Patent and Trademark Office*